United States Patent
Parkhe et al.

(10) Patent No.: US 10,403,534 B2
(45) Date of Patent: Sep. 3, 2019

(54) PIXILATED COOLING, TEMPERATURE CONTROLLED SUBSTRATE SUPPORT ASSEMBLY

(71) Applicant: Applied Materials, Inc., Santa Clara, CA (US)

(72) Inventors: Vijay D. Parkhe, San Jose, CA (US); Wendell Boyd, Jr., Morgan Hill, CA (US); Matthew James Busche, Santa Clara, CA (US); Konstantin Makhratchev, Fremont, CA (US); Masanori Ono, Chiba (JP); Senh Thach, Union City, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1018 days.

(21) Appl. No.: 14/536,803

(22) Filed: Nov. 10, 2014

(65) Prior Publication Data

US 2015/0129165 A1    May 14, 2015

Related U.S. Application Data

(60) Provisional application No. 61/902,667, filed on Nov. 11, 2013.

(51) Int. Cl.
*H01L 21/67* (2006.01)
*H01J 37/32* (2006.01)
*H01L 21/683* (2006.01)

(52) U.S. Cl.
CPC .... *H01L 21/6833* (2013.01); *H01L 21/67109* (2013.01); *H01L 21/6831* (2013.01)

(58) Field of Classification Search
CPC ........................ H01L 21/67109; H01L 21/6833
USPC ..................................................... 156/345.53
See application file for complete search history.

(56) References Cited

U.S. PATENT DOCUMENTS

| 4,956,043 A | * | 9/1990 | Kanetomo | H01J 37/32935 156/345.27 |
| 5,186,238 A | | 2/1993 | del Puerto et al. | |
| H1145 H | * | 3/1993 | Anderson | 118/724 |
| 5,882,411 A | * | 3/1999 | Zhao | C23C 16/455 118/715 |
| 6,490,146 B2 | | 12/2002 | Wang et al. | |

(Continued)

FOREIGN PATENT DOCUMENTS

| JP | 10284382 A | * | 10/1998 | G03F 7/70875 |
| WO | 2007/131057 A2 | | 11/2007 | |

OTHER PUBLICATIONS

International Search Report to PCT/US2015/010468 dated Apr. 28, 2015, 13 pgs.

(Continued)

*Primary Examiner* — Charlee J C Bennett
(74) *Attorney, Agent, or Firm* — Patterson + Sheridan LLP

(57) ABSTRACT

Implementations described herein provide a pixelated substrate support assembly which enables both lateral and azimuthal tuning of the heat transfer between an electrostatic chuck and a cooling base comprising the substrate support assembly, which in turn, allows both lateral and azimuthal tuning of a substrate processed on the substrate support assembly. A processing chamber having a pixelated substrate support assembly and method for processing a substrate using a pixelated substrate support assembly are also provided.

20 Claims, 6 Drawing Sheets

(56) References Cited

U.S. PATENT DOCUMENTS

| | | | |
|---|---|---|---|
| 6,534,750 B1* | 3/2003 | Tanoue | H01L 21/67109 118/224 |
| 6,538,872 B1 | 3/2003 | Wang et al. | |
| 6,685,467 B1* | 2/2004 | Subramanian | F27B 17/0025 165/80.1 |
| 6,686,570 B2* | 2/2004 | Furukawa | H01L 21/67103 219/444.1 |
| 6,740,853 B1 | 5/2004 | Johnson et al. | |
| 6,753,272 B1* | 6/2004 | Lee | C23C 16/481 118/688 |
| 7,771,564 B2* | 8/2010 | Yokogawa | H01J 37/32431 118/715 |
| 8,226,769 B2 | 7/2012 | Matyushkin et al. | |
| 8,461,674 B2 | 6/2013 | Gaff et al. | |
| 8,546,732 B2 | 10/2013 | Singh | |
| 8,587,113 B2 | 11/2013 | Gaff et al. | |
| 8,624,168 B2 | 1/2014 | Gaff et al. | |
| 8,637,794 B2 | 1/2014 | Singh et al. | |
| 8,642,480 B2 | 2/2014 | Gaff et al. | |
| 8,663,391 B2 | 3/2014 | Matyushkin et al. | |
| 8,884,194 B2 | 11/2014 | Singh et al. | |
| 8,937,800 B2 | 1/2015 | Lubomirsky et al. | |
| 9,196,514 B2 | 11/2015 | Parkhe et al. | |
| 2004/0115947 A1* | 6/2004 | Fink | H01L 21/67103 438/716 |
| 2004/0187787 A1* | 9/2004 | Dawson | C23C 16/4586 118/728 |
| 2005/0092013 A1* | 5/2005 | Emoto | G03F 7/70691 62/304 |
| 2006/0076109 A1 | 4/2006 | Holland et al. | |
| 2008/0017104 A1 | 1/2008 | Matyushkin et al. | |
| 2009/0274590 A1 | 11/2009 | Willwerth et al. | |
| 2010/0039747 A1* | 2/2010 | Sansoni | H01L 21/6833 361/234 |
| 2010/0163188 A1 | 7/2010 | Tanaka et al. | |
| 2011/0090719 A1 | 4/2011 | Benjamin | |
| 2011/0092072 A1 | 4/2011 | Singh et al. | |
| 2011/0147363 A1 | 6/2011 | Yap et al. | |
| 2012/0055403 A1* | 3/2012 | Gomi | C23C 16/4404 118/725 |
| 2012/0091104 A1* | 4/2012 | Tavassoli | H01L 21/67069 219/121.4 |
| 2012/0285619 A1 | 11/2012 | Matyushkin et al. | |
| 2012/0285658 A1* | 11/2012 | Roy | H01L 21/67109 165/47 |
| 2013/0161305 A1 | 6/2013 | Ptasienski et al. | |
| 2013/0220989 A1 | 8/2013 | Pease et al. | |
| 2013/0269368 A1 | 10/2013 | Gaff et al. | |
| 2014/0004702 A1 | 1/2014 | Singh | |
| 2014/0020834 A1 | 1/2014 | Zhou et al. | |
| 2014/0045337 A1 | 2/2014 | Singh et al. | |
| 2014/0047705 A1 | 2/2014 | Singh et al. | |
| 2014/0048529 A1 | 2/2014 | Pease | |
| 2014/0096909 A1 | 4/2014 | Singh et al. | |
| 2014/0154819 A1 | 6/2014 | Gaff et al. | |
| 2014/0177123 A1* | 6/2014 | Thach | H01L 21/67103 361/234 |
| 2014/0209596 A1* | 7/2014 | Lubomirsky | H01L 21/6831 219/465.1 |
| 2015/0129165 A1 | 5/2015 | Parkhe et al. | |
| 2015/0155193 A1 | 6/2015 | Hsu et al. | |
| 2015/0170977 A1 | 6/2015 | Singh | |
| 2015/0187625 A1 | 7/2015 | Busche et al. | |
| 2015/0187626 A1 | 7/2015 | Parkhe et al. | |
| 2015/0228513 A1 | 8/2015 | Parkhe et al. | |
| 2015/0311105 A1 | 10/2015 | Sadjadi et al. | |
| 2015/0340255 A1* | 11/2015 | Parkhe | H01L 21/67109 165/287 |
| 2015/0364354 A1 | 12/2015 | Tantiwong et al. | |
| 2015/0366004 A1 | 12/2015 | Nangoy et al. | |
| 2016/0027678 A1 | 1/2016 | Parkhe et al. | |

OTHER PUBLICATIONS

International Search Report and Written Opinion for PCT/US2015/029725 dated Aug. 19, 2015.
International Search Report PCT/US2014/0647635, dated Feb. 24, 2015 consists of 4 pages.
Written Opinion of the International Searching Authority PCT/US2014/0647635, dated Feb. 24, 2015 consists of 11 pages.

\* cited by examiner

PIXILATED COOLING, TEMPERATURE CONTROLLED SUBSTRATE SUPPORT ASSEMBLY

CROSS REFERENCE TO RELATED APPLICATIONS

This application claims benefit of U.S. Provisional Patent Application Ser. No. 61/902,667, filed Nov. 11, 2013, which is incorporated by reference in its entirety.

BACKGROUND

Field

Implementations described herein generally relate to semiconductor manufacturing and more particularly to temperature controlled substrate support assembly and method of using the same.

Description of the Related Art

As the feature size of the device patterns get smaller, the critical dimension (CD) requirement of features becomes a more important criterion for stable and repeatable device performance. Allowable CD variation across a substrate processed within a processing chamber is difficult to achieve with due to chamber asymmetries such as chamber and substrate temperature, flow conductance, and RF fields.

In processes utilizing an electrostatic chuck disposed on a cooling base to secure the substrate during processing, uniform temperature control across the surface of the substrate is even more challenging due to the non-homogeneous construction of the chuck below the substrate. For example, some regions of the electrostatic chuck have gas holes, while other regions have lift pin holes that are laterally offset from the gas holes. Still other regions have chucking electrodes, while other regions have heater electrodes that are laterally offset from the chucking electrodes. Since the structure of the electrostatic chuck can vary both laterally and azimuthally, uniformity of heat transfer between the chuck and substrate is very difficult to obtain, resulting in local hot and cold spots across the chuck surface, which consequently results in non-uniformity of processing results on the substrate.

The lateral and azimuthal uniformity of heat transfer between the chuck and substrate laterally is further complicated by heat transfer schemes commonly utilized in conventional cooling bases to which the electrostatic chuck is mounted. For example, conventional cooling bases typically have only edge to center temperature control. Thus, local hot and cold spots within the electrostatic chuck cannot be compensated for utilizing the heat transfer features of conventional cooling bases.

Thus, there is a need for an improved substrate support assembly.

SUMMARY

Implementations described herein provide a pixelated substrate support assembly which enables both lateral and azimuthal tuning of the heat transfer between an electrostatic chuck and a cooling base comprising the substrate support assembly, which in turn, allows both lateral and azimuthal tuning of a substrate processed on the substrate support assembly. A processing chamber having a pixelated substrate support assembly and method for processing a substrate using a pixelated substrate support assembly are also provided.

In one embodiment, a substrate support assembly is provided which includes a substrate support member and a cooling base. The substrate support member has a first surface configured to support a substrate and a second surface. The cooling base includes a base body and a plurality of cells formed in base body. The base body has a first surface and a second surface. The first surface of the base body is coupled to the second surface of the substrate support member. Each cell has a bottom adjacent the first surface of the base body such that a web of base body material is defined between the bottom and the first surface of the base body. A plurality of fluid inlet passages are disposed in the base body. Each fluid inlet passages having an outlet paired with a respective one of the cells. At least one thermal choke laterally separates at least two neighboring cells.

In another embodiment, a processing chamber is provided that includes an electrostatic chuck disposed in a chamber body. The electrostatic chuck has a first surface configured to support a substrate and a second surface. A metallic cooling base is also disposed in the chamber body. The cooling base includes a first surface and a second surface. The first surface of the base is bonded to the second surface of the substrate support member. The cooling base also includes plurality of cells formed in base. Each cell is configured to receive an independently controllable flow of heat transfer fluid. Each cell has a web of base material disposed between the cell and the electrostatic chuck, wherein each web is thermally isolated from at least one adjacent web.

In yet another embodiment, a method for processing a substrate is provided that includes processing a substrate supported on a substrate support assembly having an electrostatic chuck disposed on a cooling base, and, while processing the substrate, flowing a heat transfer fluid into a first cell formed in a cooling base at a rate different than a rate of heat transfer fluid flowing into a second cell formed in the cooling base, the cells laterally separated by a thermal choke.

BRIEF DESCRIPTION OF THE DRAWINGS

So that the manner in which the above recited features of the present invention can be understood in detail, a more particular description of the invention, briefly summarized above, may be had by reference to implementations, some of which are illustrated in the appended drawings. It is to be noted, however, that the appended drawings illustrate only typical implementations of this invention and are therefore not to be considered limiting of its scope, for the invention may admit to other equally effective implementations.

To facilitate understanding, identical reference numerals have been used, where possible, to designate identical elements that are common to the figures. It is contemplated that elements disclosed in one implementation may be beneficially used in other implementations without specific recitation.

DETAILED DESCRIPTION

Implementations described herein provide a pixelated substrate support assembly which enables both lateral and azimuthal tuning of the heat transfer between an electrostatic chuck and a cooling base comprising the substrate support assembly, which in turn, allows both lateral and azimuthal tuning of the lateral temperature profile of a substrate processed on the substrate support assembly. Moreover, the pixelated substrate support assembly also enables local hot or cold spots on the substrate to be substantially eliminated. Methods for tuning of a lateral temperature profile a substrate processed on a pixelated substrate support assembly are also described herein. Although the pixelated substrate support assembly is described below in an etch processing chamber, the pixelated substrate support assembly may be utilized in other types of plasma processing chambers, such as physical vapor deposition chambers, chemical vapor deposition chambers, ion implantation chambers, among others, and other systems where azimuthal tuning of a lateral temperature profile is desirable.

In one or more embodiments, the pixelated substrate support assembly allows for the correction of critical dimension (CD) variation at the edge of the substrate during etching by allowing the substrate temperature to be utilized to compensate for chamber non-uniformities, such as temperature, flow conductance, electrical fields, plasma density and the like. Additionally, some embodiments have demonstrated the ability to control the temperature uniformity across the substrate to less than about ±1 degrees Celsius at up to about a 60 degrees temperature differential between the electrostatic chuck and the cooling medium flowing through the temperature control base.

Figure 1:
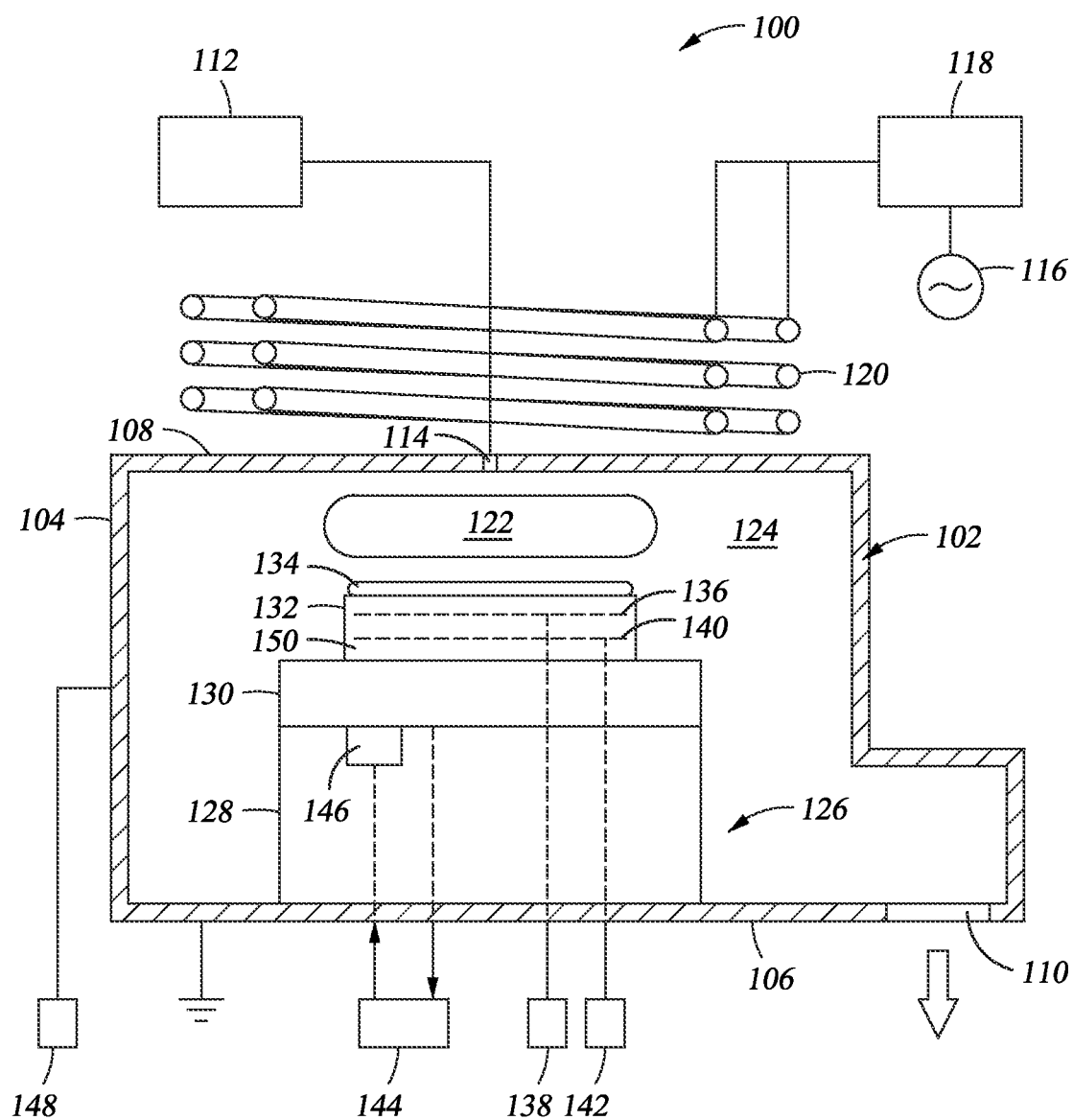
FIG. 1 is a cross-sectional schematic view of a processing chamber having one embodiment of a temperature controlled substrate support assembly.

FIG. 1 is a cross-sectional schematic view of an exemplary etch processing chamber 100 having a pixelated substrate support assembly 126. As discussed above, the pixelated substrate support assembly 126 may be utilized in other processing chamber, for example plasma treatment chambers, annealing chambers, physical vapor deposition chambers, chemical vapor deposition chambers, and ion implantation chambers, among others, as well as other systems where azimuthal tuning of a temperature profile is desirable.

The processing chamber 100 includes a grounded chamber body 102. The chamber body 102 includes walls 104, a bottom 106 and a lid 108 which enclose an internal volume 124. The pixelated substrate support assembly 126 is disposed in the internal volume 124 and supports a substrate 134 thereon during processing.

The walls 104 of the processing chamber 100 include an opening (not shown) through which the substrate 134 may be robotically transferred into and out of the internal volume 124. A pumping port 110 is formed in one of walls 104 or bottom 106 of the chamber body 102 and is fluidly connected to a pumping system (not shown). The pumping system is utilized to maintain a vacuum environment within the internal volume 124 of the processing chamber 100, while removing processing byproducts.

A gas panel 112 provides process and/or other gases to the internal volume 124 of the processing chamber 100 through one or more inlet ports 114 formed through at least one of the lid 108 or walls 104 of the chamber body 102. The process gas provided by the gas panel 112 are energized within the internal volume 124 to form a plasma 122 utilized to process the substrate 134 disposed on the substrate support assembly 126. The process gases may be energized by RF power inductively coupled to the process gases from a plasma applicator 120 positioned outside the chamber body 102. In the embodiment depicted in FIG. 1, the applicator 120 is a pair of coaxial coils coupled through a matching circuit 118 to an RF power source 116.

A controller 148 is coupled to the processing chamber 100 to control operation of the processing chamber 100 and processing of the substrate 134. The controller 148 may be one of any form of general-purpose data processing system that can be used in an industrial setting for controlling the various subprocessors and subcontrollers. Generally, the controller 148 includes a central processing unit (CPU) in communication with memory and input/output (I/O) circuitry, among other common components. Software commands executed by the CPU of the controller 148, cause the processing chamber to, for example, introduce an etchant gas mixture (i.e., processing gas) into the internal volume 124, form the plasma 122 from the processing gas by application of RF power from the applicator 120, and etch a layer of material on the substrate 134.

The substrate support assembly 126 generally includes a cooling base 130 and a substrate support member, for example an electrostatic chuck 132. The substrate support assembly 126 may be removably coupled to a support member 128 which is mounted to the chamber body 102. The substrate support assembly 126 may be periodically removed from the support member 128 to allow for refurbishment of the substrate support assembly 126.

The electrostatic chuck 132 generally includes a chucking electrode 136 embedded in a dielectric body 150. The chucking electrode 136 may be configured as a mono polar or dipolar electrode, or other suitable arrangement. The chucking electrode 136 is coupled to a chucking power source 138 which provides a RF or DC power to electrostatically secure the substrate 134 to the upper surface of the dielectric body 150. The dielectric body 150 may be fabricated from a ceramic material, such as AlN, or a polymer, such as polyimide, polyetheretherketone, polyaryletherketone and the like.

The electrostatic chuck 132 may optionally include one or more resistive heaters 140. The resistive heaters 140 are coupled to a heater power source 142. The operation of the heater power source 142 may be controlled by the controller 148. In one embodiment, the resistive heaters 140 include a plurality of laterally separated heating zones, wherein the controller 148 enables one zone of resistive heaters 140 to be preferentially heated relative to one or more other zones. The electrostatic chuck 132 may also include one or more thermocouples (not shown) for providing temperature feedback information to the controller 148 for controlling the power applied by the heater power source 142 to the resistive heaters 140, and for operating the cooling base 130, as further described below.

The electrostatic chuck 132 may also include gas passages (not shown) for providing backside heat transfer gas to the interstitial space defined between the substrate 134 and upper surface of the electrostatic chuck 132. The electrostatic chuck 132 may also include lift pin holes for accommodating lift pins (both not shown) for elevating the substrate 134 above the upper surface of the electrostatic chuck 132 to facilitate robotic transfer into and out of the processing chamber 100.

The temperature controlled cooling base 130 is coupled to a heat transfer fluid source 144. The heat transfer fluid source 144 provides a heat transfer fluid, such as a liquid, gas or combination thereof, which is independently circulated in a plurality of pixel cells, as further described below, thereby enabling local control of the heat transfer between the electrostatic chuck 132 and cooling base 130, and ultimately, control of the lateral temperature profile of the substrate 134.

A fluid distributor 146 is fluidly coupled between an outlet of the heat transfer fluid source 144 and the temperature controlled cooling base 130. The fluid distributor 146 operates to control the amount of heat transfer fluid provided to respective pixel cells as further described below. The fluid distributor 146 may be disposed outside of the processing chamber 100, within the substrate support assembly 126, within the support member 128 or other suitable location.

Figure 2:
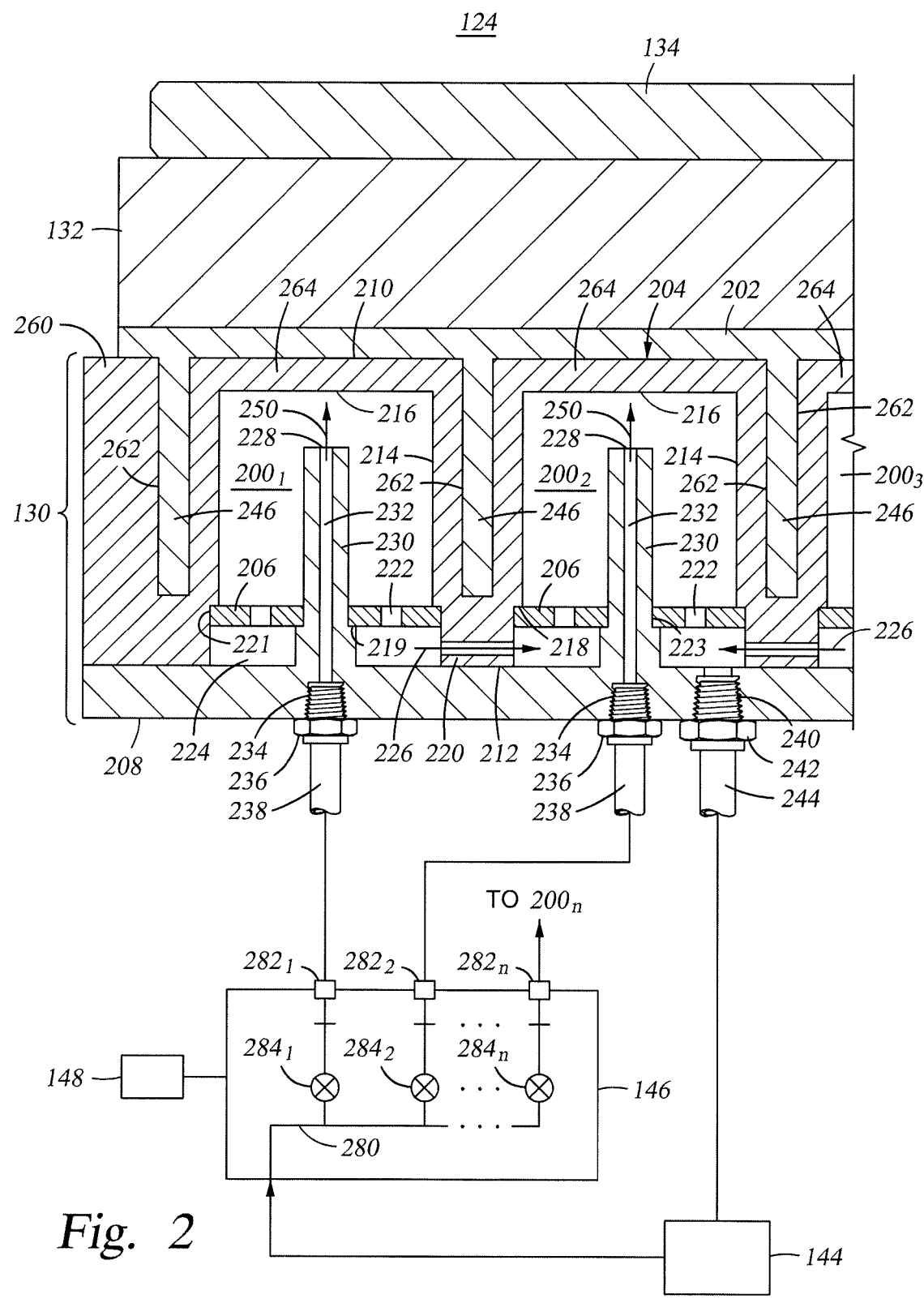
FIG. 2 is a partial cross-sectional schematic view of the substrate support assembly detailing portions of a cooling base disposed below an electrostatic chuck.

FIG. 2 is an enlarged partial cross-sectional schematic view of a portion of the substrate support assembly 126 detailing portions of the cooling base 130. In one embodiment, the cooling base 130 is coupled to the electrostatic chuck 132 utilizing a bonding agent 202. The bonding agent 202 may be adhesive, such as an acrylic-based adhesive, an epoxy, a neoprene-based adhesive or other suitable adhesive. In one embodiment, the bonding agent 202 is an epoxy. The bonding agent 202 may have a coefficient of thermal conductivity selected in a range from 0.01 to 200 W/mK and, in one exemplary embodiment, in a range from 0.1 to 10 W/mK. The adhesive materials comprising the bonding agent 202 may additionally include at least one thermally conductive ceramic filler, e.g., aluminum oxide ($Al_2O_3$), aluminum nitride (AlN), and titanium diboride ($TiB_2$), and the like. The bonding agent 202 may be removed when refurbishing one or both of the cooling base 130 and electrostatic chuck 132. In other embodiments, the cooling base 130 is removably coupled to the electrostatic chuck 132 utilizing fasteners or clamps (not shown).

The cooling base 130 includes a plurality of pixel cells, collectively referred to as pixel cells 200. The pixel cells 200 are generally an enclosed volume within the cooling base 130 in which heat transfer fluid provided by heat transfer fluid source 144 may be separately circulated to effectuate heat transfer between the cooling base 130 and electrostatic chuck 132. The number of cells 200 formed in the cooling base 130 may vary, and it is contemplated that in excess of 10 and even in excess of 100 pixel cells 200 may be laterally arranged across the cooling base 130. Exemplary distribution of the pixel cells 200 are described with reference to FIGS. 3A-3C further below. Each pixel cell 200 may be independently coupled to the heat transfer fluid source 144 through the fluid distributor 146 so that the flow of heat transfer fluid, and thus the temperature of cooling base 130 at each cell 200, may be independently controlled relative to the neighboring cells 200. Each cell 200 may also be thermally isolated from the neighboring cells 200, for example, using a thermal choke 262, which enables more precise greater temperature control. The thermal isolation between cells 200 contributes to the ability to control the temperature uniformity across the substrate to very small tolerances which enable precise process and CD control when processing the substrate 134. Additionally, thermal isolation between cells 200 enables temperature control at specific locations of the substrate support assembly 146 substantially without affecting the temperature of neighboring areas, thereby allowing local hot and cool spots to be compensated for without introducing skewing or other temperature asymmetries. For example, the substrate support assembly 126 having a plurality of thermally isolated temperature control cells 200 has demonstrated the ability to control the temperature uniformity of a substrate processed thereon to less than about ±1 degrees Celsius with temperature gradients of up to about a 60 degrees temperature differential between the electrostatic chuck 132 and the cooling medium flowing through the temperature controlled cooling base 130.

The cooling base 130 generally includes at least a base body 204 and a base cap 208. The cells 200 are formed in one or both of the base body 204 and the base cap 208. In the embodiment depicted in FIG. 2, each cell 200 is formed in the base body 204. The base body 204 and the base cap 208 may be coupled together in a manner that substantially prevents leakage between adjoining cells 200. For example, the base body 204 may be brazed for fastened with an adhesive to the base cap 208. Alternatively, the base body 204 may be fastened or clamped the base cap 208, and utilize seals such as o-rings (not shown) to prevent leakage between adjoining cells 200.

The base body 204 may be fabricated from a material having a good heat transfer coefficient, such as a metal, such as aluminum or aluminum alloy. Other thermally conductive materials may also be utilized. The base body 204 may be generally cylindrical in plan form, but may also be of other geometrical shapes. The base body 204 has an upper surface 210 and a lower surface 212. The upper surface 210 faces the electrostatic chuck 132, while the lower surface 212 faces the base cap 208.

The cells 200 are open to the lower surface 212 of the base body 204 and includes sidewalls 214 and a bottom 216. The bottom 216 of each cell 200 is separated from the upper surface 210 of the base body 204 by a web 264 of base body material through which heat transfer between the electrostatic chuck 132 and fluid disposed in the cell 200 is routed.

The thermal chokes 262 are formed in the upper surface 210 of the base body 204. The thermal chokes 262 extend into sidewalls 214 the base body 204, thus separating and thermally isolating the web 264 defined at the bottom 216 of one cell 200 from the web 264 defined at the bottom 216 of the neighboring cells 200. By extending into the sidewalls 214, each cell 200 is more efficiently isolated from neighboring cells 200, while also ensuring good temperature isolation between the neighboring webs 264, which consequently allows the heat transfer between the electrostatic chuck 134 and the cooling base 130 to be locally and independently controlled through each individual web 264 with little influence from the rate of heat transfer occurring at neighboring or other webs 264 distributed across the cooling base 130. Thus, by individually and independently controlling the heat transfer through each web 264, pixel by pixel approach to temperature control can be realized which enables specific points of the substrate to be heated or cool, thus allowing truly addressable lateral temperature profile tuning and control.

An additional thermal choke 262 may be formed between the radially outermost cells 200 and a laterally outermost sidewall 260 of the base body 204. This outermost thermal choke 262 located between the cells 200 and the laterally outermost sidewall 260 of the base body 204 minimizes heat transfer between the cells 200 adjacent the sidewall 260 and the internal volume 124 of the processing chamber 100, thereby allowing more precise temperature control closer to the edge of the substrate support assembly 126, and as a result, better temperature control to the outside diameter edge of the substrate 134.

The thermal choke 262 is generally an area of discontinuity of the coefficient of thermal conductivity within the base body 204 which has a coefficient of thermal conductivity less than that of surrounding material comprising the base body 204. For example, the thermal choke 262 may be a material within the base body 204 having a lower coefficient of thermal conductivity. In another example, the thermal choke 262 may be slot, hollow or groove formed in the base body 204, which may or may not be filled with a material having a lower coefficient of thermal conductivity than the material forming the base body 204. In the embodiment depicted in FIG. 2, the thermal choke 262 is filled with a material 246 which has a lower coefficient of thermal conductivity than the material forming the base body 204, for example, the material 246 may be a portion of the bonding agent 202 utilized to secure the electrostatic chuck 132 to the cooling base 130.

Figure 3A:
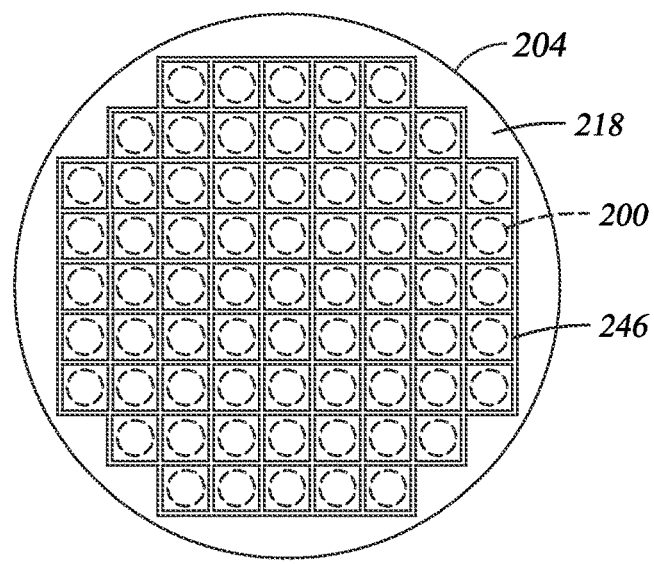
FIG. 3A is a top view of one embodiment of the cooling base depicted in FIG. 2.

Referring now to the top view of the base body 204 depicted in FIG. 3A, a thermal choke 262 is shown formed in the upper surface 210 of the base body 204, wherein at least one portion of the thermal choke 262 is disposed between each neighboring cell 200, shown in phantom in FIG. 3A. The number of cells 200 is for illustration only, as up to and exceeding 100 cells 200 may be located across the cooling base 130. In one embodiment, at least one thermal choke 262 circumscribes an associated cell 200. For example, each cell 200 may be circumscribed by a respective thermal choke 262. In another embodiment the thermal choke 262 may be web having a plurality of open areas, each open area having one cell 200 positioned therein. For example, the thermal choke 262 may be in the form of a grid, wherein a respective one of the cells 200, which may also be arranged in a grid pattern, are disposed in the open areas defined by the grid. Although the grid pattern is shown as an X/Y grid comprised of rows and columns, the grid may alternatively have a hexagonal, close packed, or other form.

Figure 3B:
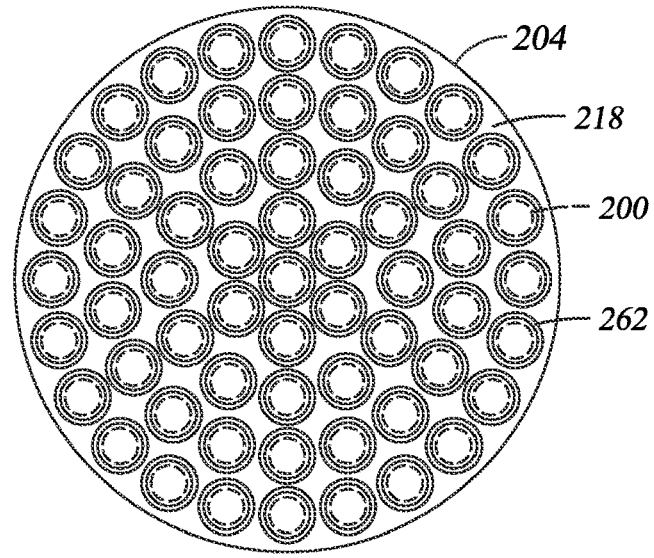
FIGS. 3B-3E are top views of alternative embodiments of a cooling base which may be utilized in the substrate support assembly depicted in FIG. 2.

FIG. 3B is a top view of another embodiment of the base body 204 illustrating a plurality of thermal chokes 262 formed in the upper surface 210 of the base body 204 in a polar array. Optionally, one or more of the thermal chokes 262 may be interconnected. The polar array pattern of the thermal chokes 262 separates the neighboring cells 200, which may also be arranged in a polar array. At least one of the thermal chokes 262 isolates one or more cells 200 from neighboring cells 200. In the embodiment depicted in FIG. 3B, each cell 200 is isolated from a neighboring cell 200 by at least one thermal choke 262.

Figure 3C:
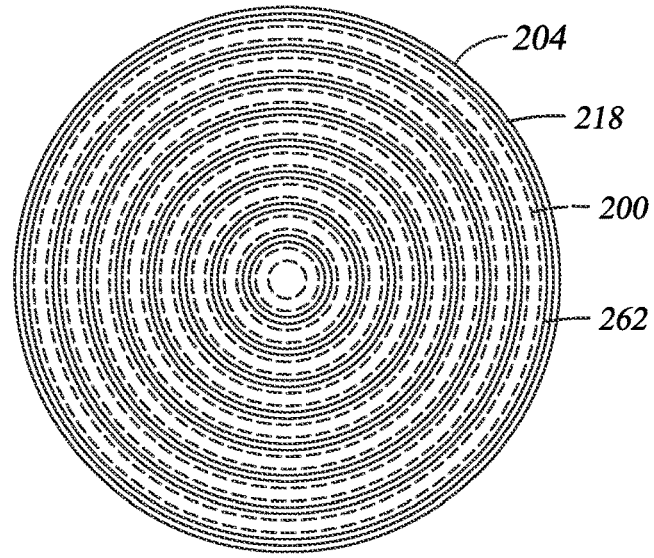

FIG. 3C is a top view of another embodiment of the base body 204 illustrating a plurality of thermal chokes 262 formed in the upper surface 210 of the base body 204 in concentric channels. The concentric channel pattern of the thermal chokes 262 separates one group of neighboring cells 200 from another group of neighboring cells 200, which may also be arranged in a concentric manner.

Figure 3D:
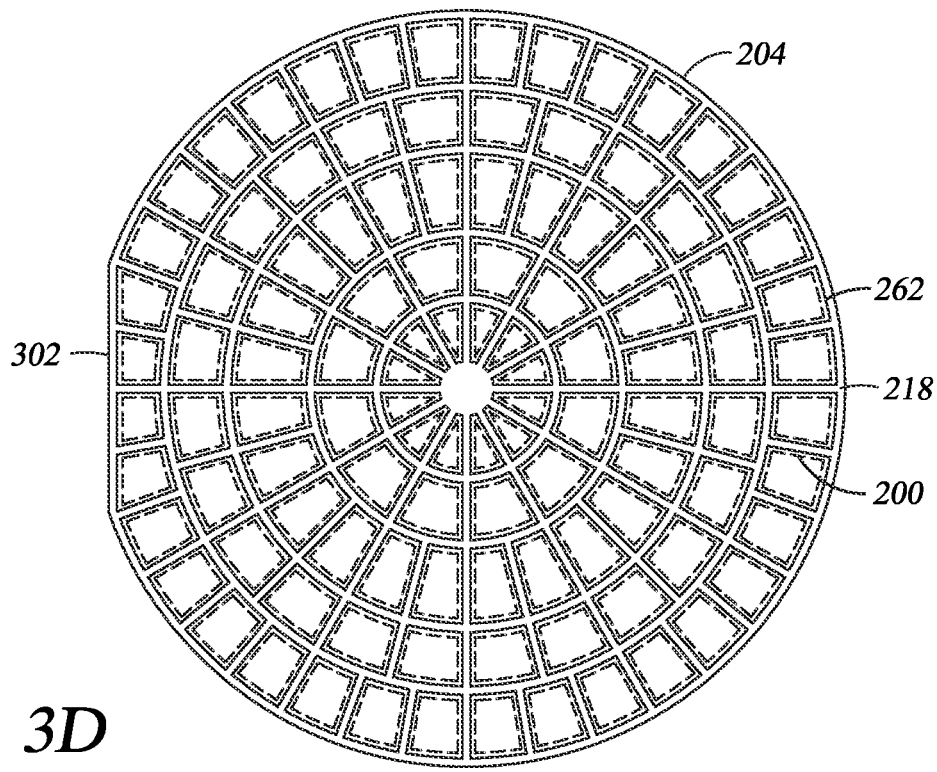

FIG. 3D is a top view of another embodiment of the base body 204 illustrating a plurality of thermal chokes 262 formed in a polar array in the upper surface 210 of the base body 204. The polar array of the thermal chokes 262 separates one group of neighboring cells 200 from another group of neighboring cells 200. Similar sized elements of the thermal chokes 262 defining the polar array may be arranged on a common radius, such that groups of thermal chokes 262 having a similar size are arranged concentrically with other groups of thermal chokes 262 having a similar size elements. Additionally, the thermal chokes 262 may be arranged in a polar array of thermal chokes wedge-shaped groups. In one embodiment, the wedge-shaped groups include more thermal chokes 262 near the outer perimeter of the base body 204 relative to the number of thermal chokes 262 proximate the center of the base body 204. Optionally, one side of the base body 204 may includes a flat 302 configured to match the flat of a substrate to be processed on the base body 204.

Figure 3E:
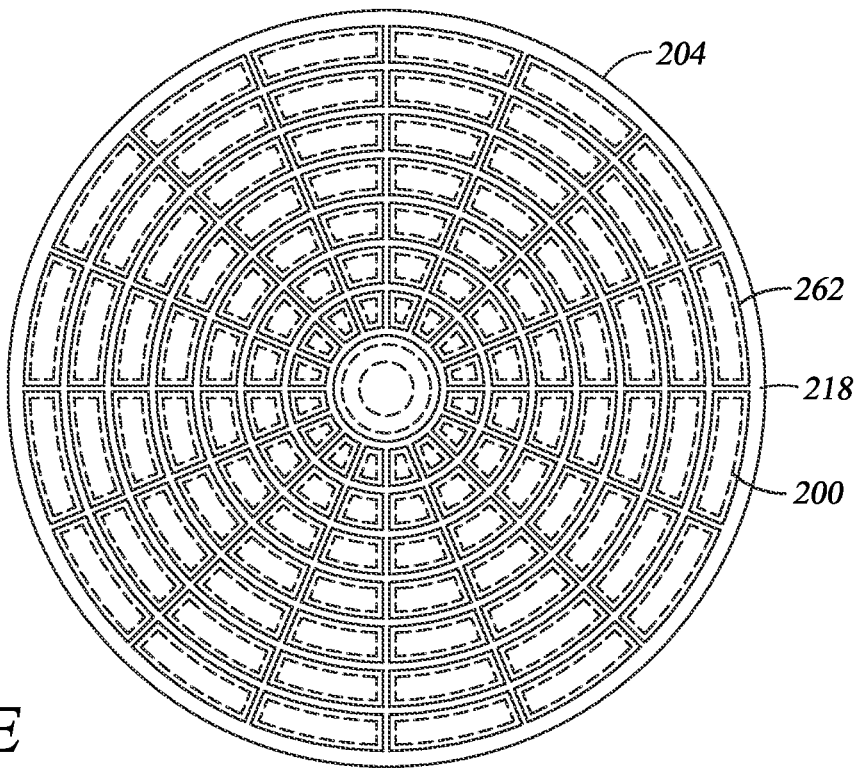

FIG. 3E is a top view of another embodiment of the base body 204 illustrating a plurality of thermal chokes 262 formed in the upper surface 210 of the base body 204 in arc segments forming a polar array. The arc segments pattern of the thermal chokes 262 separates one group of neighboring cells 200 from another group of neighboring cells 200, which may also be arranged in a concentric manner.

It is contemplated that the thermal choke(s) 262 and cells 200 may be arranged in other orientations.

Referring back to FIG. 2, the base cap 208 may be formed from a metal, metallic or other suitable material, such as aluminum, aluminum alloy or stainless steel, among others. A plurality of nozzle posts 230 extend from an upper surface of the base cap 208, wherein at least one nozzle post 230 projects into a respective one of the cells 200. An inlet port 234 is formed in the base cap 208 and is coupled by a passage 232 extending through the nozzle post 230 to a fluid outlet 228. The inlet port 234 is coupled to the heat transfer fluid source 144 through the fluid distributor 146. A fitting 236 is engaged with the inlet port 234 to couple the cell 200 to the heat transfer fluid source 144 via tubing 238. The nozzle post 230 is of sufficient length to position the fluid outlet 228 formed at the distal end of the nozzle post 230 in close proximity to the bottom 216 of the cell 200. Thus, fluid from the heat transfer fluid source 144 is provided into the cell 200 to control the rate of heat transfer through the web 264. In some embodiments, the fluid outlet 228 directs the flow or spray of heat transfer fluid from the heat transfer fluid source 144 directly against the bottom 216 of the cell 200 as shown by arrows 250, thereby increasing the rate of heat transfer through the web 264 and ultimately with the substrate 134. By directing the flow or spray of heat transfer fluid directly against the bottom 216 of the cell 200, the response time needed to change the temperature of substrate 134 is also reduced.

The fluid within the cell 200 is returned to the heat transfer fluid source 144 via one or more outlet ports 240 formed in the base cap 208. A fitting 242 is engaged with the outlet port 240 to couple the cell 200 to the heat transfer fluid source 144 via tubing 244. In some embodiments, each cell 200 may includes a dedicated outlet port 240. In other embodiments, one or more cells 200 may share one or more outlet ports 240.

In some embodiments, the cooling base 130 may also include a divider plate 206 which separates the volume defined in each cell 200 from a return plenum 224 defined between the divider plate 206 and base cap 208. The return plenum 224 is in fluid communication with the outlet port 240 formed through the base cap 208.

The divider plate 206 includes a plurality of apertures 222 form through the plate 206, one or more of the apertures 222 fluidly coupling each volume defined by each cell 200 with the return plenum 224. The sidewalls 214 of the base body 204 include lateral passages 220 formed between the divider plate 206 and the lower surface 212 of the base body 204 to interconnect the regions of the plenum 224 below each cell 200 to a fluid outlet port 240 formed through the base cap 208, thereby allowing the heat transfer fluid exiting each cell 200 through the divider plate 206 to be removed from the cooling base 130 through a single outlet port 240.

The divider plate 206 may be secured between the base body 204 and the base cap 208 in any suitable fashion. In the embodiment depicted in FIG. 2, the divider plate 206 has an aperture 223 that seats on a step 218 formed in the sidewalls 214 of the base body 204, and an aperture 221 that seats on a step 219 formed in the nozzle post 230 of the base cap 208.

In the embodiment depicted in FIG. 2, the fluid distributor 146 includes an inlet manifold 280 which is coupled to the heat transfer fluid source 144. A plurality of flow controllers, collectively referred to as flow controllers 284, are coupled in parallel between the inlet manifold 280 and a respective distributor outlet port, collectively referred to as distributor outlet ports 282. Each distributor outlet port 282 is coupled by tubing 238 to the inlet fitting 236 for respectively supplying heat transfer fluid from the heat transfer fluid source 144 to a respective one of the cells 200. The controller 148 may be coupled to the fluid distributor 146 to control the operation of each flow controllers 284, thereby controlling the amount and/or rate of fluid provided to each cells 200 relative to other cells 200 within the cooling base 130. For example, a first fluid controller $284_1$ may be set by the controller 148 to provide a selected amount of heat transfer fluid to a first distributor outlet port $282_1$ which is delivered to the first cell $200_1$ of the cooling base 130; while a second fluid controller $284_2$ may be set by the controller 148 to provide a selected amount of heat transfer fluid to a second distributor outlet port $282_2$ which is delivered to the second cell $200_2$ of the cooling base 130; until the $N^{th}$ controllers $284_N$ is set by the controller 148 to provide a selected amount of heat transfer fluid to the $N^{th}$ distributor outlet port $282_N$ which is delivered to the $N^{th}$ cell $200_N$ of the cooling base 130. N being a positive integer greater than 2. Thus, by selectively controlling the flow to each cell 200, the temperature provide of the substrate 134 may be tuned to obtain desirable processing results.

Figure 4:
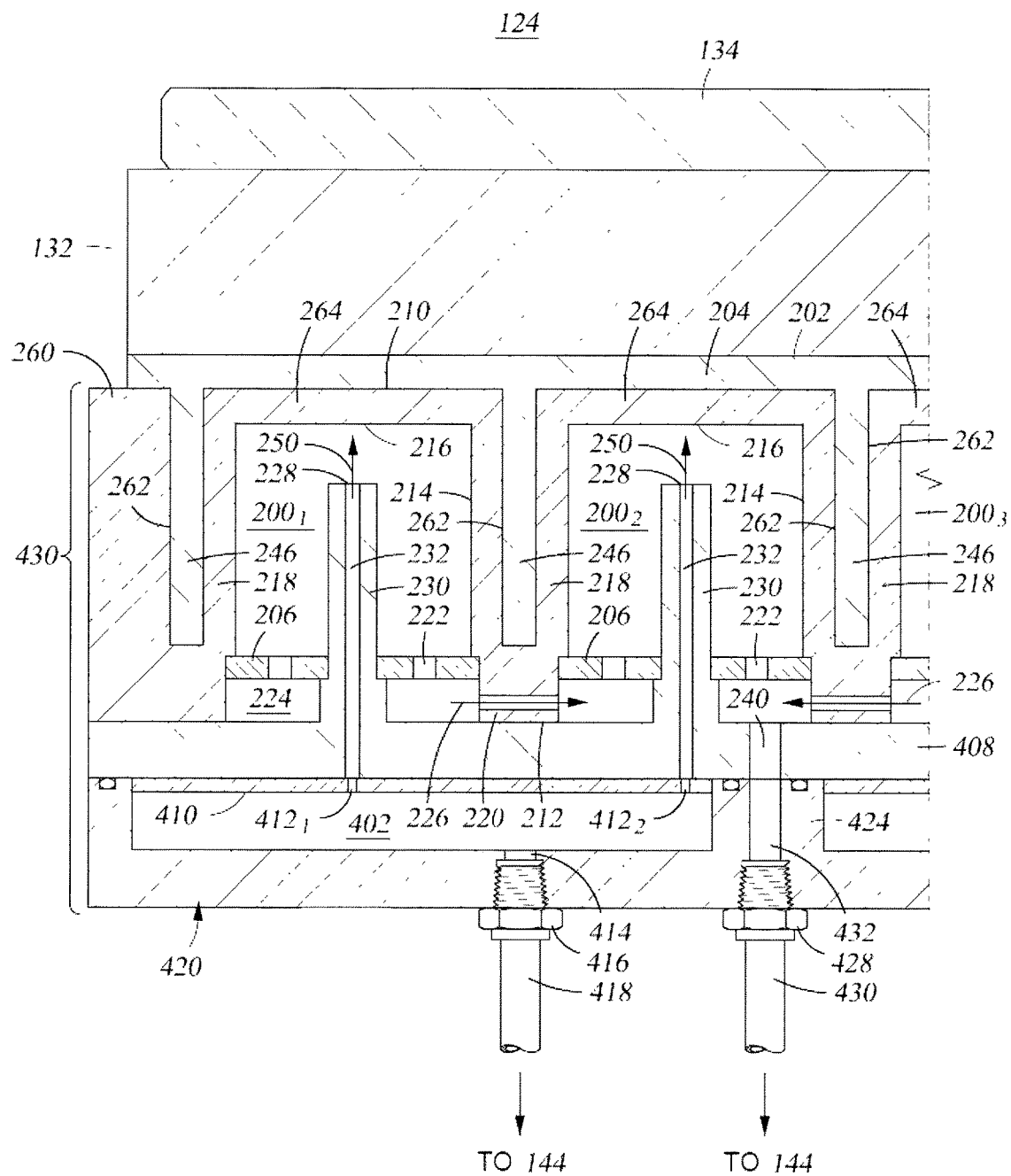
FIG. 4 is a partial cross-sectional schematic view of another embodiment of a substrate support assembly detailing portions of an electrostatic chuck disposed on a cooling base which may be utilized in the processing chamber of FIG. 1.

FIG. 4 is a enlarged partial cross-sectional schematic view of a portion of the substrate support assembly 426 detailing portions of a cooling base 430. The substrate support assembly 426 and the cooling base 430 are substantially similar to the substrate support assembly 126 and the cooling base 130 described above, except wherein the fluid distributor 146 which relies on flow controllers is replace by fluid distributor 410 which utilizes different size orifices (collectively referred to as orifices 412) to control the relative amount of heat transfer fluid provide to respective cells 200 formed within the cooling base 430.

Similar to the cooling base 130 described above, the cooling base 430 includes a base body 204, a divider plate 206, a base cap 408 and a plenum cap 420. The base cap 408 is similar to the base cap 208 of the substrate support assembly 126 described above, except wherein the base cap 408 does not include inlet and outlet ports 414, 432. The inlet and outlet ports 414, 432 in the embodiment depicted in FIG. 4 are located in the plenum cap 420.

The plenum cap 420 is coupled below the base cap 408 such that an inlet plenum 402 is defined between the plenum cap 420 and the base cap 408. The inlet plenum 402 is fluidly coupled to the inlet port 414, which in turn is coupled via a fitting 416 and tubing 418 to the heat transfer fluid source 144. The plenum cap 420 may also include a boss 424 having the outlet port 432 formed therethrough. The boss 424 extends through the inlet plenum 402 and seals against the lower surface of the base cap 408. The passage 426 through the boss 424 aligns with the outlet port 240 formed through the base cap 408, thereby connecting the outlet port 432 to the return plenum 224.

The fluid distributor 410 is disposed in the inlet plenum 402 between the plenum cap 420 and the base cap 408. The fluid distributor 410 includes a plurality of orifices 412, each orifice 412 fluidly coupled to a respective one of the fluid passages 232 providing heat transfer fluid to a respective one of the cells 200. The relative size of the orifices 412 may be selected to determine the relative amount of heat transfer fluid provide to each individual cell 200, thereby enabling the lateral temperature profile of the substrate 134 to be tuned. For example, a first orifice $412_1$ may have a first diameter that controls the flow of heat transfer fluid from the inlet plenum 402 to the first cell $200_1$, while a second orifice $412_2$ may have a second diameter (different than the first diameter) that controls the flow of heat transfer fluid from the inlet plenum 402 to the second cell $200_2$ at a rate different than the rate provide to the first cell $200_1$, and so on for the rest of the cells 200 of the cooling base 430. The diameter of each orifice 412 may be selected base on computation, modeling or measured temperature readings. For example, a thermal image may be taken of the substrate 134 or electrostatic chuck 132 while in use to determine the lateral and azimuthal temperature distribution across the substrate 134 or electrostatic chuck 132. The fluid distributor 410 may be removed from the cooling base 426 and the diameter of each orifice 412 selected to tune flow distribution to each cell 200 so that the temperature distribution across the substrate can be tuned to meet a desired criteria. The fluid distributor 410 may also be swapped out of the cooling base 426 to allow the lateral temperature profile of the substrate support assembly to be selected to meet changing processing criteria, for example, when switching from etching one type of material to another type of material between production runs.

Figure 5:
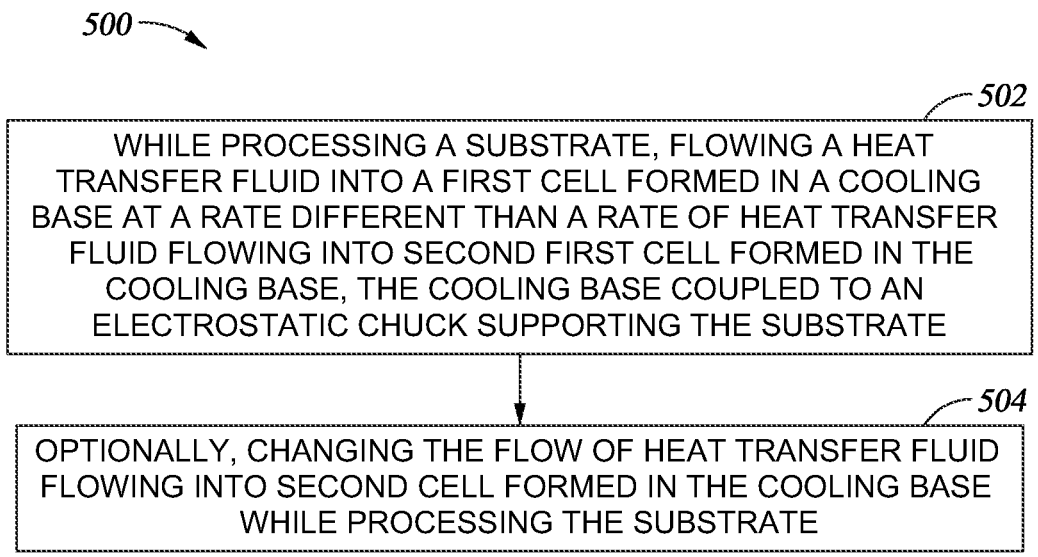
FIG. 5 is a flow diagram of one embodiment of a method for processing a substrate utilizing a pixelated substrate support assembly.

FIG. 5 is a flow diagram of one embodiment of a method 500 for processing a substrate utilizing a pixelated substrate support assembly, such as the substrate support assemblies described above, among others. The method 500 begins at block 502 by flowing a heat transfer fluid into a first cell formed in a cooling base at a rate different than a rate of heat transfer fluid flowing into a second cell formed in the cooling base while processing a substrate on a substrate support assembly having an electrostatic chuck disposed on the cooling base. Processing the substrate may include plasma etching a layer of material disposed on the substrate, depositing a layer of material on the substrate using a physical or chemical vapor deposition process, vacuum annealing the substrate, implanting ions into the substrate or other semiconductor fabrication process.

Optionally, at block 504, the rate of heat transfer fluid flowing into the second cell may be changed while processing the substrate. The rate of heat transfer fluid flowing into the second cell may be changed in response to feed back from a temperature sensed on the substrate, a change in processing parameters, such as gas flow, plasma power, pressure, temperature and the like, or other processing characteristic.

In some embodiments, thermal chokes are utilized between the cells to improve the thermal isolation between cells, and accordingly, improve the temperature control across the substrate. In some embodiments, the grid or array arrangement of the cells allows for local hot or cool spot to be compensated for, and to allow lateral (e.g., etch to center) and azimuthal tuning of the temperature profile across the surface of the substrate.

While the foregoing is directed to implementations of the present invention, other and further implementations of the invention may be devised without departing from the basic scope thereof, and the scope thereof is determined by the claims that follow.

We claim:

1. A substrate support assembly, comprising:
a substrate support member having an upper surface configured to support a substrate, and a lower surface opposite the upper surface; and
a cooling base comprising:
a base body having an upper surface and a lower surface, the upper surface of the base body coupled to the lower surface of the substrate support member;
a plurality of cells formed in the base body, each cell comprising:
a first cell surface opposite the upper surface of the base body such that a web of base material is defined between the first cell surface and the upper surface of the base body, the first cell surface being the web of base material;
a protruded fluid outlet having an orientation selected to direct fluid exiting the protruded fluid outlet against the first cell surface, wherein the protruded fluid outlet extends into each cell of the plurality of cells; and
a divider plate positioned opposite the first cell surface, the divider plate including a plurality of apertures formed therethrough, each aperture of the plurality of apertures coupling each cell to a return plenum;
an outlet port coupled to the return plenum;
a plurality of fluid inlet passages each paired with a-respective one of protruded fluid outlets; and
at least one thermal choke extending from the substrate support member in between a first cell of the plurality of cells and a second cell of the plurality of cells, the second cell being adjacent to the first cell, wherein the at least one thermal choke is disposed in between a first sidewall of the first cell and a second sidewall of the second cell, each of the first sidewall and the second sidewall being formed from the web of base material.

2. The substrate support assembly of claim 1, wherein the cells are arranged in a grid.

3. The substrate support assembly of claim 1, wherein the cells are arranged in a polar array.

4. The substrate support assembly of claim 1, further comprising:
another thermal choke disposed between an edge of the cooling base and the plurality of cells.

5. The substrate support assembly of claim 1, wherein the at least one thermal choke comprises: a groove in the upper surface of the base body.

6. The substrate support assembly of claim 5, wherein the groove is filled with bonding material having a thermal coefficient less than a thermal coefficient of a material comprising the cooling base.

7. The substrate support assembly of claim 5, wherein the groove is filled with a material bonding the substrate support member to the cooling base.

8. The substrate support assembly of claim 1, wherein the substrate support member is an electrostatic chuck.

9. The substrate support assembly of claim 1 further comprising:
a fluid distributor having a first orifice and a second orifice, each orifice having a different size and configured to direct fluid into separate cells at different rates.

10. The substrate support assembly of claim 1 further comprising:
a fluid distributor configured to direct fluid into separate cells at different rates, the fluid distributor positioned in a support member coupled to the cooling base.

11. The substrate support assembly of claim 1 further comprising: a fluid distributor configured to direct fluid into separate cells at different rates, the fluid distributor positioned remote from the substrate support assembly.

12. The substrate support assembly of claim 1, wherein the substrate support member is a ceramic electrostatic chuck, and wherein the cooling base comprises aluminum.

13. A processing chamber, comprising:
a chamber body,
an electrostatic chuck disposed in the chamber body, the electrostatic chuck having an upper surface configured to support a substrate and a lower surface; and
a metallic cooling base having an upper surface and a lower surface, the upper surface of the cooling base bonded to the lower surface of the electrostatic chuck, the cooling base comprising:
a plurality of cells formed in the cooling base, each cell configured to receive an independently controllable flow of heat transfer fluid, each cell having a web of base material disposed between the cell and the electrostatic chuck, each web of base material being thermally isolated from at least one adjacent web of base material, each cell comprising:
a first cell surface opposite the upper surface of the cooling base such that a web of base material is defined between the first cell surface and the upper surface of the cooling base;
a protruded fluid outlet having an orientation selected to direct fluid exiting the protruded fluid outlet against the first cell surface; and
a divider plate positioned opposite the first cell surface, the divider plate including a plurality of apertures formed therethrough, each aperture of the plurality of apertures coupling each cell to a return plenum;
an outlet port coupled to the return plenum;
a plurality of fluid inlet passages each paired with a respective one of protruded fluid outlets; and
at least one thermal choke extending from the electrostatic chuck in between a first cell of the plurality of cells and a second cell of the plurality of cells, the second cell being adjacent to the first cell, wherein the at least one thermal choke is disposed in between a first sidewall of the first cell and a second sidewall of the second cell, each of the first sidewall and the second sidewall being formed from the web of base material.

14. The processing chamber of claim 13, further comprising one or more thermal chokes disposed between neighboring cells.

15. The processing chamber of claim 14, wherein the one or more thermal chokes extend between sidewalls of neighboring cells.

16. The processing chamber of claim 13, wherein the cells are arranged in a grid or polar array.

17. The processing chamber of claim 13 further comprising:
another thermal choke disposed between an edge of the cooling base and the plurality of cells.

18. The processing chamber of claim 14, wherein the at least one thermal choke comprises:
a groove in the upper surface of the cooling base.

19. The processing chamber of claim 18, wherein the groove is filled with a material having a thermal coefficient less than a thermal coefficient of a material comprising the cooling base.

20. A method for controlling a temperature of a substrate, comprising:
- processing a substrate supported on a substrate support assembly having an electrostatic chuck disposed on a cooling base; and
- while processing the substrate, flowing a heat transfer fluid into a first cell formed in a cooling base at a rate different than a rate of heat transfer fluid flowing into a second cell formed in the cooling base, the first and second cells laterally separated by a thermal choke, wherein flowing the heat transfer fluid comprising:
- directing fluid exiting a protruded fluid outlet against a surface opposite an upper surface of the cooling base such that a web of base material is defined between the first cell surface and the upper surface of the cooling base;
- and
- flowing the fluid through an interior volume of the first cell, to an outlet of each cell, wherein each fluid passage of a plurality of fluid inlet passages is paired with a respective one of protruded fluid outlets and at least one thermal choke separates the first cell from a second, neighboring cell.

\* \* \* \* \*